(12) United States Patent
Yieh et al.

(10) Patent No.: US 6,599,574 B1
(45) Date of Patent: Jul. 29, 2003

(54) METHOD AND APPARATUS FOR FORMING A DIELECTRIC FILM USING HELIUM AS A CARRIER GAS

(75) Inventors: Ellie Yieh, Millbrae, CA (US); Paul Gee, San Jose, CA (US); Li-Qun Xia, Santa Clara, CA (US); Francimar Campana, Milpitas, CA (US); Shankar Venkataranan, Santa Clara, CA (US); Dana Tribula, Palo Alto, CA (US); Bang Nguyen, Fremont, CA (US)

(73) Assignee: Applied Materials Inc., Santa Clara, CA (US)

( * ) Notice: Subject to any disclaimer, the term of this patent is extended or adjusted under 35 U.S.C. 154(b) by 0 days.

(21) Appl. No.: 08/627,631

(22) Filed: Apr. 4, 1996

(51) Int. Cl.[7] .............................................. C23C 16/00

(52) U.S. Cl. ........................ 427/255.29; 427/255.31; 427/255.38; 438/905; 438/906

(58) Field of Search ........................ 427/255.3, 255.2, 427/255.1, 255, 99, 255.29, 255.31, 255.38; 438/905, 906

(56) References Cited

U.S. PATENT DOCUMENTS

| 4,492,716 A | | 1/1985 | Yamazaki |
| 5,000,113 A | | 3/1991 | Wang et al. |
| 5,166,101 A | * | 11/1992 | Lee et al. ................... 437/238 |
| 5,324,539 A | | 6/1994 | Maeda et al. |

FOREIGN PATENT DOCUMENTS

| JP | 05-047758 | * | 2/1993 |
| JP | 05-267480 | * | 10/1993 |

OTHER PUBLICATIONS

F.S. Becker et al., "A New LPCVD Borophosphosilicate Glass Process Based on the Doped Deposition of TEOS–Oxide," *ECS Ext. Abstr.*, vol. 85–2, pp. 380–381, (1985).

S.M. Fisher, Characterizing B–, P–, and Ge–Doped Silicon Oxide Films for Interleval Dielectrics, *Solid State Technology*, pp. 55–64, Sep. 1993.

(List continued on next page.)

Primary Examiner—Bret Chen
(74) Attorney, Agent, or Firm—Townsend and Townsend and Crew

(57) ABSTRACT

The present invention relates to the deposition of dielectric layers, and more specifically to a method and apparatus for forming dielectric layers such as borophosphosilicate glass (BPSG) having improved film uniformity, higher deposition rate, superior gap fill/reflow capability, and smoother surface morphology. The method forms a dielectric layer with a process using helium carrier gas that produces substantially less downstream residue than conventional methods and apparatus, thereby reducing the need for chamber cleaning and increasing throughput of processed wafers. The present invention utilizes helium instead of nitrogen as carrier gas in a process for forming a dielectric layer such as BPSG to provide various unexpected benefits. According to one aspect, the present invention forms a dielectric film on a substrate, and prolongs a period between chamber cleanings in a system by using helium which produces substantially less downstream and upstream residue than a process using nitrogen. The method includes introducing a process gas containing silicon, oxygen, and first dopant atoms into the chamber; using helium as the carrier gas in the system; and processing more substrates between cleanings than a process using nitrogen as carrier gas. A further aspect of the invention includes annealing the dielectric films formed on the substrates at a lower temperature than required by the process using nitrogen as carrier gas.

25 Claims, 13 Drawing Sheets

OTHER PUBLICATIONS

M. Galiano, et al., "Effect of Deposition Pressure and $O_3$ On $O_3$–TEOS Sub–Atmospheric Chemical Vapor Deposited Borophosphosilicate Glass (SACVD BPSG)," *AVS International Conference*, Apr. 26, 1994. No page numbers.

V. Siva, et al, "Carrier–Gas Effects on Reflow Characteristics of High Deposition Rate CVD Ozone–TEOS BPSG Films," *International Conference on Metallurgical Coatings and Thin Film* , Apr. 26, 1995. No page numbers.

* cited by examiner

METHOD AND APPARATUS FOR FORMING A DIELECTRIC FILM USING HELIUM AS A CARRIER GAS

BACKGROUND OF THE INVENTION

The present invention relates to the deposition of dielectric layers, and more specifically to a method and apparatus for forming a dielectric layer such as a borophosphosilicate glass (BPSG) layer, having improved film uniformity, superior gap fill/reflow capability, and smoother surface morphology. In addition to resulting in a higher deposition rate, the method of the present invention forms the dielectric layer in a manner that produces substantially less downstream residue than conventional methods. The method reduces the frequency of reactor cleaning to increase throughput of processed wafers. The present invention is particularly useful when forming a dielectric layer used as a premetal dielectric (PMD) layer, but may also be applied to the formation of intermetal dielectric (IMD) layers, passivation layers, and other layers.

One of the primary steps in the fabrication of modern semiconductor devices is the formation of a thin film, for example, an oxide of silicon, on a semiconductor substrate. Silicon oxide is widely used as an insulating layer in the manufacture of semiconductor devices. A silicon oxide film can be deposited by thermal chemical vapor deposition (CVD) or plasma-enhanced chemical vapor deposition (PECVD) processes from a reaction of silane ($SiH_4$), tetraethylorthosilicate ($Si(OC_2H_5)_4$, hereinafter referred to as "TEOS") or a similar silicon source, with an oxygen source such as $O_2$, ozone ($O_3$), or the like. Conventional thermal CVD processes supply reactive gases to the substrate surface where heat-induced chemical reactions take place to produce a desired film. PECVD processes promote excitation and/or disassociation of the reactant gases by the application of radio frequency energy to a reaction zone proximate the substrate surface, thereby creating a plasma of highly-reactive species to produce the desired film.

Semiconductor device geometries have dramatically decreased in size since such devices were first introduced several decades ago. Since then, integrated circuits have generally followed the two-year/half-size rule (often called "Moore's Law") which means that the number of devices that fit on a chip doubles every two years. Wafer fabrication plants today are routinely producing devices with 0.5 $\mu$m and even 0.35 $\mu$m size features. Tomorrow's plants soon will be producing devices having even smaller geometries. As device sizes become smaller and integration density increases, issues that were not previously considered important by the industry are becoming of paramount concern.

One particular use for a silicon oxide film is as a separation layer between the polysilicon gate/interconnect layer and the first metal contact layer for MOS transistor connections. Such separation layers are referred to as premetal dielectric (PMD) layers because they are typically deposited before any of the metal layers in a multilevel metal structure. In addition to having a low dielectric constant, low stress, good gettering capability, and good adhesion properties, it is important for PMD layers to have good planarization characteristics or be compatible with planarization techniques. When used as a PMD layer, the silicon oxide film is deposited over a lower level polysilicon gate/interconnect layer that usually contains raised or stepped surfaces. The initially deposited film generally conforms to the topography of the poly layer and is typically planarized before an overlying metal layer is deposited. A standard reflow process, in which the oxide film is heated to a temperature at which it flows, may be used to planarize the film. With small device dimensions, it is critical in some processes that reflow of PMD layers and other process steps be carried out below 800° C. to maintain shallow junctions and prevent the degradation of self-aligned titanium silicide contact structures or the like. As an alternative to reflow, a chemical mechanical polishing (CMP) or etching technique may be used.

Because of its low dielectric constant, low stress, good adhesion properties, good gettering capability, and capability to reflow at high temperatures, boron phosphorus silicate glass (BPSG) is one silicon oxide film that has found particular applicability in PMD layers. Standard BPSG films are formed by introducing phosphorus and boron sources into a processing chamber along with the silicon and oxygen sources normally required to form a silicon oxide layer. Examples of phosphorus sources include triethylphosphate (TEPO), triethylphosphite ($TEP_i$), trimethylphosphate (TMOP), trimethylphosphite ($TMP_i$), and similar compounds. Examples of boron sources include triethylborate (TEB), trimethylborate (TMB), diborane ($B_2H_6$) and similar compounds. Deposition techniques include atmospheric pressure CVD (APCVD), sub-atmospheric pressure CVD (SACVD), low pressure CVD (LPCVD), and plasma enhanced CVD (PECVD). Most semiconductor manufacturers utilize $SiH_4$-based BPSG films to reflow at high temperatures (>900° C.) for 0.5 $\mu$m and greater device geometries. At geometries less than 0.5 $\mu$m, stringent thermal budget and gap fill requirements necessitate the use of chemistries such as $TEOS/O_3$ which provide films of excellent gap fill and reflow capability. For example, $TEOS/O_3$-based BPSG films produced by APCVD or SACVD using nitrogen carrier gas can be reflowed at greater than 900° C. or subjected to a rapid thermal process and CMP to achieve gap fill and planarization. Conventional BPSG processes, especially APCVD, use nitrogen ($N_2$) as the carrier gas to transport vaporized liquid sources, like the TEOS, TEB, and TEPO, into the chamber.

BPSG films at a 2–6 weight percent (wt %) boron concentration and a 2–9 wt % phosphorus concentration are often used for reflow. At these concentration levels, the reflow temperature of known BPSG films formed using nitrogen carrier gas with $TEOS/O_3$ is generally greater than about 850° C. With conventional BPSG processes using a nitrogen carrier gas, BPSG films can be produced which flow at temperatures below 850° C. by increasing the concentration of boron to 4.5 wt % or higher. The stability of the BPSG layer, however, is adversely affected at such increased boron concentrations.

Conventional BPSG processes using nitrogen as a carrier gas in forming silicon oxide layers often encounter problems in fabricating smaller geometry devices, such as filling closely-spaced gaps on semiconductor structures. These processes using nitrogen carrier gas result in as-deposited step coverage that is not optimal, and therefore require higher temperatures to achieve gap fill and planarization requirements. That is, conventional BPSG processes using nitrogen as the carrier gas result in reflow temperatures over 850° C., which are often too high for tighter thermal budgets.

The use of helium as the carrier gas in other processes has been mentioned previously, with some even experimenting with its use in BPSG processes. However, the industry has relied primarily on nitrogen as the carrier gas in the BPSG process, mainly because nitrogen is cheaper than helium.

Also, the industry did not recognize helium carrier gas as having benefits that outweigh the advantage of nitrogen's reduced cost.

With growing pressure on manufacturers to improve efficiency, another problem is the need for frequent system maintenance procedures to clean the reactor system by removing the residue formed after the repeated processing of hundreds of wafers. During CVD processing, deposition gases released inside a processing chamber form a thin BPSG layer on the surface of a substrate being processed. Unwanted oxide deposition occurs elsewhere in the reactor, for example, on areas such as the walls of the processing chamber during such CVD processes. In closed vacuum systems, some of the undeposited gas molecules are pumped out of the chamber, along with partially reacted compounds and reaction by-products, through a vacuum line, commonly referred to as the "foreline." Many of the compounds in this exhausted gas are still in highly reactive states and/or contain residues or particulate matter that can form unwanted deposits in the foreline, as well as in various parts of the chamber including, for example, the area between the gas box and gas distribution plate. In open nonvacuum systems such as APCVD systems, undesired oxide residue is deposited on the entire exhaust channel. Failure to clean the residue from the reactor and exhaust channels often results in degraded, unreliable processes and defective wafers. Without frequent cleaning procedures, the residue particulates built up in the reactor and exhaust can migrate onto the wafer. The problem of particulates causing damage to the devices on the wafer is of particular concern with today's increasingly small device dimensions.

Thus, system maintenance is important for the smooth operation of wafer processing, as well as resulting in improved wafer yield and better product performance. Typically, two types of cleaning procedures are possible. The first cleaning procedure uses an etchant gas, optionally formed with a plasma, to remove residue from chamber walls and other areas. The first cleaning procedure is performed without opening the chamber. Commonly performed between deposition steps for every wafer or every n wafers, this first cleaning procedure adequately cleans the chamber walls, but residue often remains in the foreline and other areas of the chamber. To clean the foreline and these other areas adequately, the duration of the cleaning operation may be increased, but this adversely affects wafer throughput.

The second cleaning procedure involves opening the chamber system and physically wiping the entire reactor, including the foreline (for a vacuum system), exhaust, and other areas having accumulated residue, with a special cloth and cleaning fluids. This second cleaning procedure, often referred to as a preventive maintenance cleaning, is time-consuming because the chamber must be opened and manually cleaned. Occurring periodically during the processing of wafers, the preventive maintenance cleaning operation is performed less often than the first cleaning procedure. Preventive maintenance cleaning constitutes a serious, albeit necessary, interruption in the manufacturing of wafers. The frequent preventive maintenance cleanings associated with conventional processes using nitrogen as the carrier gas impact the continuous production of wafers in the manufacturing line. It is desirable to increase the number of wafers between each time-consuming maintenance procedure. This reduces total unproductive time and increases the total number of wafers produced.

From the above, it can be seen that an oxide film having good gap fill and stability after lower temperature reflows is desirable. It can also be seen that a method and apparatus for forming an oxide film that allows processing as many high quality wafers as possible, without the need for frequent chamber maintenance, while minimizing undesirable residues formed during processing such wafers is desirable.

SUMMARY OF THE INVENTION

The present invention addresses the above problems of the prior art by providing a method and related apparatus for forming a dielectric layer having good gap fill capability, stability, and low reflow temperature with less frequently required chamber cleaning procedures. In particular, the method and apparatus relate to forming a dielectric layer, such as BPSG, of high quality, while obtaining additional previously unknown and unexpected benefits in the manufacturing process.

The present invention involves the use of helium instead of nitrogen as carrier gas in a process for forming a dielectric layer such as BPSG to provide various unexpected benefits. According to one embodiment, the present invention provides a method for forming a dielectric film on a substrate. The use of helium produces substantially less downstream and upstream residue than a process using nitrogen. The method includes introducing process gas containing silicon, oxygen, and first dopant atoms into the chamber; using helium as the carrier gas in the system; and processing more substrates between cleanings than a process using nitrogen as carrier gas. A further advantage of the invention is that the dielectric films formed on the substrates may be subsequently annealed to achieve gap fill and planarization at a lower temperature than with films formed by the same process using nitrogen as carrier gas.

The present method may be performed in a substrate processing system. The system includes a housing for forming a chamber; a susceptor, located within the housing, for holding a substrate; a gas distribution manifold, located within the housing and situated substantially parallel to the susceptor, for introducing process gases into the chamber. The system also includes a gas mixing chamber, coupled to the gas distribution manifold, into which a first plurality of gases are introduced using a helium carrier gas to form the process gases; and a source distribution system, coupled to the gas mixing chamber, for introducing the first plurality of gases into the gas mixing chamber, the source distribution system including a source of helium carrier gas. Additionally, the system includes a heater for heating the substrate, and a processor for controlling the source distribution system and the heater. The system further includes a memory coupled to the processor and storing a program for directing the operation of the CVD reactor system. The program is responsive to a user input to stop processing a straight run of substrates in order to perform a cleaning, where the user input is not used for an accumulated deposited film thickness greater than 350 $\mu$m.

DETAILED DESCRIPTION OF THE SPECIFIC EMBODIMENTS

I. Exemplary CVD Reactor System

Figure 1:
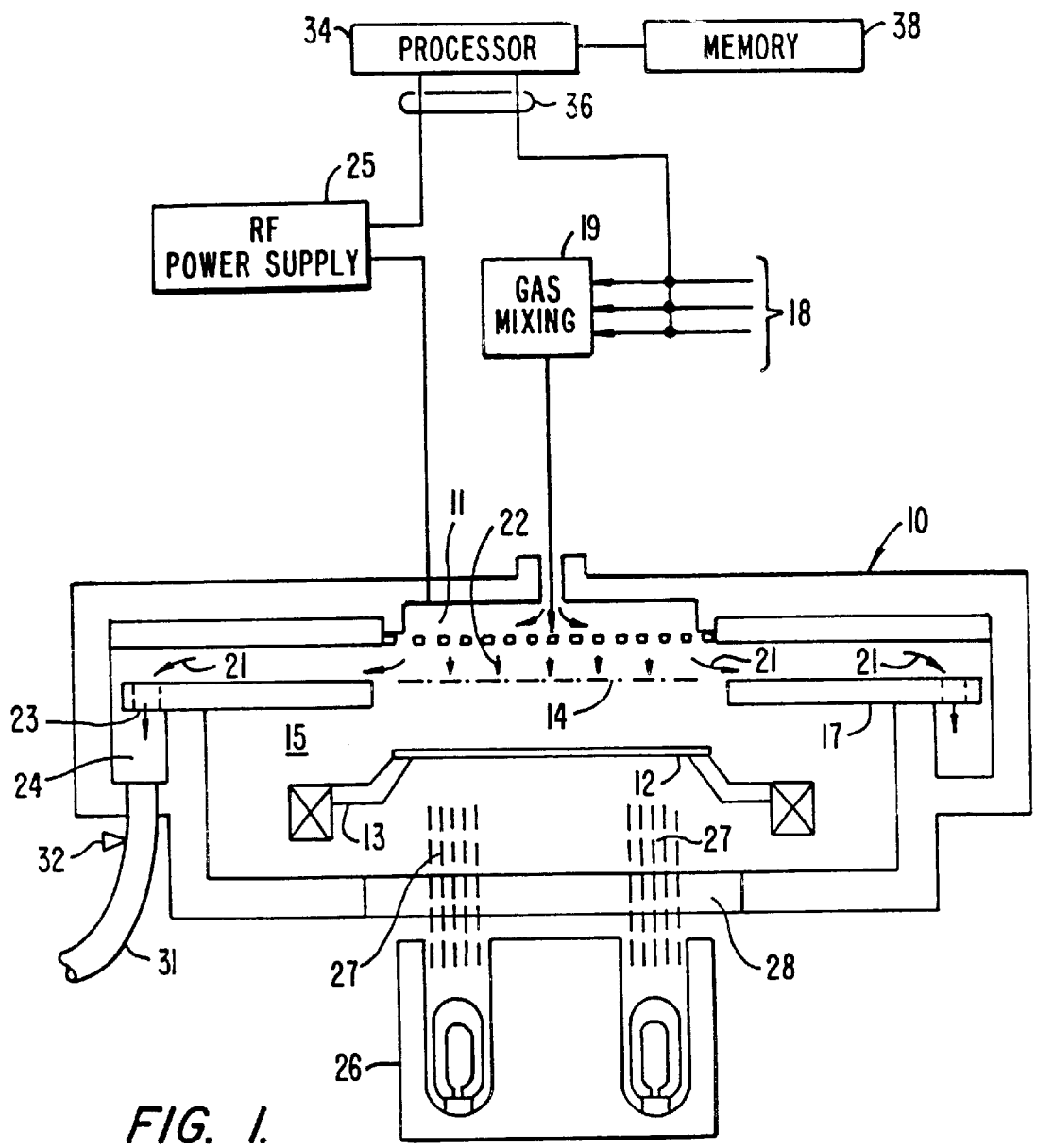
FIG. 1 is a vertical, cross-sectional view of one embodiment of a simplified chemical vapor deposition apparatus according to the present invention.

The dielectric layer can be formed in a variety of different CVD processing machines. One suitable CVD machine in which the method of the present invention can be carried out is shown in FIG. 1. FIG. 1 illustrates one embodiment of a simplified, parallel-plate chemical vapor deposition system 10 having a vacuum chamber 15 in which the dielectric layer according to the present invention can be deposited. Of course, chamber 15 may be an open atmospheric system having only an exhaust. CVD system 10 contains a gas distribution manifold 11 for dispersing deposition gases to a wafer (not shown) that rests on a susceptor 12. Susceptor 12 is highly thermally-responsive and is mounted on a support arm 13 so that susceptor 12 (and the wafer supported on the upper surface of susceptor 12) can be moved controllably between a lower loading/off-loading position and an upper processing position 14 that is closely adjacent to manifold 11.

When susceptor 12 and the wafer are in processing position 14, they are surrounded by a baffle plate having a plurality of spaced holes 23 which exhaust into an annular vacuum manifold 24. Deposition and carrier gases and liquids are supplied through lines 18 (having control valves not shown) into a gas mixing chamber 19 where they are combined and then sent to manifold 11. During processing, the gas inlet to manifold 11 is vented toward and uniformly distributed radially across the surface of the wafer as indicated by arrows 21 and 22. The gas is then exhausted via ports 23 into the circular vacuum manifold 24 and out an exhaust line 31 by a vacuum pump system (not shown). The rate at which gases are released through exhaust line 31 is controlled by a throttle valve 32. The exhaust line 31 is the vacuum line previously referred to as the "foreline" in vacuum systems. Of course, open atmospheric reactor systems such as APCVD systems do not include a vacuum pump system at exhaust line 31 so chamber 15 is not a vacuum chamber.

The process performed in CVD system 10 can be either a thermal process or a plasma enhanced process. In a plasma process, a controlled plasma is formed adjacent to the wafer by radio frequency (RF) energy applied to manifold 11 from RF power supply 25. Gas distribution manifold 11 is also an RF electrode, while susceptor 12 is grounded. RF power supply 25 can supply either single or mixed frequency RF power (or other desired variation) to manifold 11 to enhance the decomposition of reactive species introduced into chamber 15.

A circular external lamp module 26 provides a collimated annular pattern of light 27 through quartz window 28 onto susceptor 12. Such heat distribution compensates for the natural heat loss pattern of the susceptor and provides uniform and rapid thermal heating of the susceptor and wafer for effecting deposition.

A motor (not shown) raises and lowers susceptor 12 between a processing position 14 and a lower, wafer-loading position. The motor, control valves connected to lines 18, throttle valve 32, and RF power supply 25 are controlled by a processor 34 over control lines 36, of which only some are shown. Processor 34 operates under the control of a computer program stored in a memory 38. The computer program dictates the timing, mixture of gases, chamber pressure, chamber temperature, RF power levels, susceptor position, and other parameters of a particular process.

Typically, any or all of the chamber lining, gas inlet manifold faceplate, support arms 13, and various other reactor hardware is fabricated from material such as aluminum. An example of such a CVD apparatus is described in U.S. Pat. No. 5,000,113 entitled "Thermal CVD/PECVD Reactor and Use for Thermal Chemical Vapor Deposition of Silicon Dioxide and In-situ Multi-step Planarized Process," issued to Wang et al. and assigned to Applied Materials, Inc., the assignee of the present invention, and which is incorporated herein by reference for all purposes.

The above CVD system description is mainly for illustrative purposes and should not be considered as limiting the scope of the present invention. Variations of the above-described reactor, such as variations in platen or susceptor design, heater design, location of RF power connections, nonuse of vacuum pumping system, and others are possible. Additionally, other plasma CVD equipment such as electron cyclotron resonance (ECR) plasma CVD devices, induction-coupled RF high-density plasma CVD devices, or the like may be employed. Additionally, thermal CVD equipment may also be used for formation of the dielectric layer. The dielectric layer and method for forming such a layer of the present invention are not limited to any specific apparatus or to any specific plasma excitation method.

II. Exemplary Structure

Figure 2:
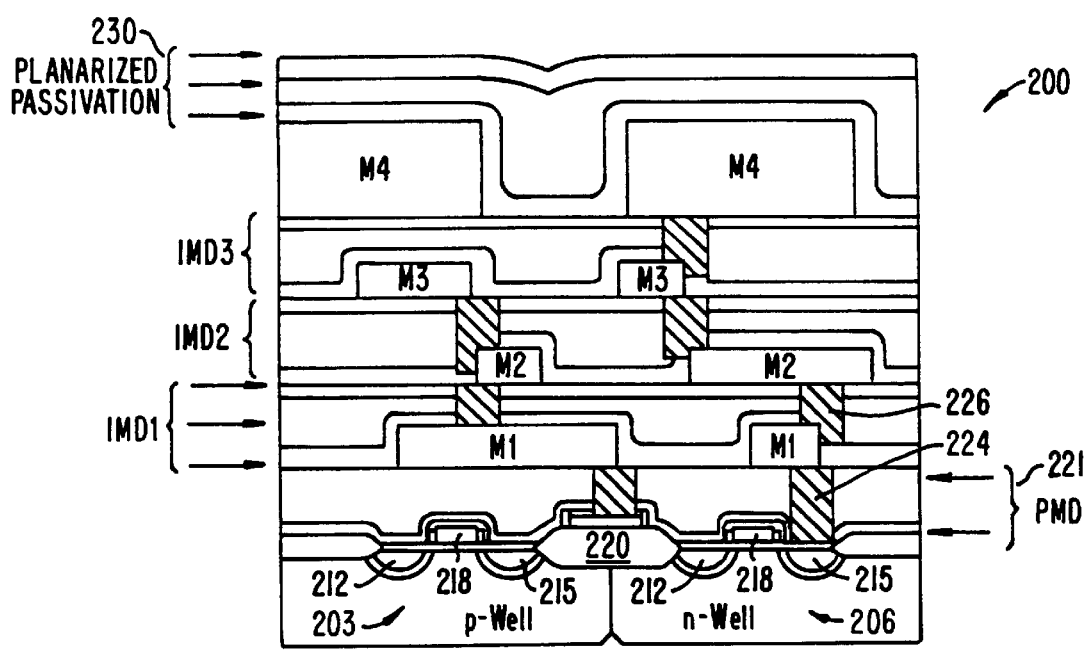
FIG. 2 is a simplified cross-sectional view of a semiconductor device manufactured according to the method of the present invention.

FIG. 2 illustrates a simplified cross-sectional view of an integrated circuit 200 according to the present invention. As shown, integrated circuit 200 includes NMOS and PMOS transistors 203 and 206, which are separated and electrically isolated from each other by a field oxide region 220. Each transistor 203 and 206 comprises a source region 212, a drain region 215 and a gate region 218.

A PMD layer 221 separates transistors 203 and 206 from metal layer M1 with connections between metal layer M1 and the transistors made by contacts 224. Metal layer M1 is one of four metal layers, M1–M4, included in integrated circuit 200. Each metal layer M1–M4 is separated from adjacent metal layers by intermetal dielectric layers IMD1, IMD2, and IMD3, respectively. Adjacent metal layers are connected at selected openings by vias 226. Deposited over metal layer M4 are planarized passivation layers 230.

While the dielectric layer of the present invention may find uses in each of the dielectric layers shown in integrated circuit 200, physical properties of the film such as its low dielectric constant, low stress, good gettering capability, and good gap-fill properties, along with the CVD process used in formation of embodiments such as BPSG films, make it most useful as a PMD layer. Of course, other embodiments such as phosphosilicate glass (PSG) or borosilicate glass (BSG) films may be particularly useful as IMD layers or other layers. Further embodiments may include fluorine-doped silicate glass, germanium-doped silicate glass, or undoped silicate glass.

III. Borophosphosilicate Glass Deposition

The method of the present invention is useful in the formation of BPSG layers according to any of several different processes, but is particularly useful for the formation of BPSG layers deposited with TEOS and ozone precursor gases. A process recipe of one such TEOS/$O_3$ BPSG film, using TEB as a boron source and TEPO as a phosphorus source, is set forth below as an example. Experimental results of the same exemplary process recipe for a BPSG film using nitrogen as the carrier gas and using helium as the carrier gas are discussed in detail later as evidence of the improvements and advantages provided by the present invention. Contrary to generally accepted industry belief that different carrier gases provide comparable results, the use of helium as the carrier gas in BPSG process results in unexpected benefits, as discussed later.

The exemplary process may be performed in CVD system 10. Of course, those of ordinary skill in the art would understand that other process recipes and other reaction chamber types may also be used to deposit the bulk BPSG films.

To form the BPSG layer, the wafer is loaded in vacuum chamber 15 onto susceptor 12 through a vacuum-lock door. Susceptor 12 is then moved to processing position 14 and the wafer is subjected to reactant gases exhausted from the gas distribution manifold. Prior to these steps, the wafer has typically been subjected to multiple processing steps.

The wafer is generally positioned less than one centimeter from gas distribution manifold 11 in processing position 14, and preferably, the wafer is between about 200–275 mil from the gas distribution manifold. Such spacing confines the reactant gases between the wafer and manifold, increasing reaction efficiency and deposition rate and helping to confine the deposition of material to the surface of the wafer. The susceptor is positioned about 150–600 mil from the gas distribution manifold and is preferably positioned about 300 mil from the manifold.

Once the wafer is properly positioned, the wafer and susceptor are heated to a temperature between 100–750° C. Preferably, the wafer and susceptor are heated to a temperature within the range of 400–500° C. and most preferably to about 480° C. These temperature ranges are maintained throughout the deposition. The reaction chamber is maintained at a pressure within a range of about 10–760 torr. Preferably, the pressure is maintained within the range of about 150–400 torr, and most preferably it is maintained at about 200 torr.

A mixture comprising TEB as the source of boron, TEPO as the source of phosphorus, TEOS as the source of silicon, and one or more gaseous sources of oxygen (such as $O_2$ or $O_3$) is formed. The TEB, TEPO and TEOS are all liquid sources that are vaporized by conventional boiler-type or bubbler-type hot boxes or preferably by a liquid injection system. A liquid injection system provides greater control of the volume of reactant liquid introduced into the gas mixing system. The vaporized gases are then mixed in the gas mixing system with a helium carrier gas before being delivered to the gas distribution manifold. Of course, it is recognized that other sources of boron, phosphorus, silicon, and oxygen also may be used.

The rate at which the individual sources are introduced into gas mixing system 19 is controlled by processor 34 through appropriate gas supply lines and valves of the source distribution system. The flow rate of TEB is preferably between about 150–200 milligrams per minute (mgm). The flow rate of TEPO is preferably between about 35–75 mgm. The TEOS flow rate is between about 300–700 mgm. Of course, the flow rates of the TEB and TEPO may be varied as desired for other dopant concentrations. The vaporized TEOS, TEB, and TEPO gases then are mixed with a carrier gas flowing at a rate between 2000–8000 standard cubic centimeters per minute (sccm) and preferably are flowing at a rate of about 6000 sccm. As discussed above, a conventional BPSG process uses nitrogen as the carrier gas. Oxygen in the form of $O_3$ is introduced at a flow rate of between about 2000–5000 sccm and is introduced preferably at a flow rate of about 4000 sccm. The ozone mixture contains between about 5–12 wt % oxygen.

A selected pressure of between about 10–760 torr in the reaction chamber is set and maintained throughout deposition by throttle valve 32 in conjunction with the vacuum pump system and introduction of the process gas. Preferably, pressure within the chamber is set and maintained at between about 150–250 torr.

After deposition of the BPSG film, the wafer may be transferred to a furnace where the film is reflowed at a temperature as low as about 800–900° C. for between about 30–40 minutes in an inert nitrogen gas atmosphere. Alternatively, the wafer may be transferred to a rapid thermal process reactor where the film is reflowed at a temperature between about 750–1000° C. for less than a minute.

The above-described gas flow, chamber pressure and temperature ranges provide for a BPSG film that is deposited at a rate of between about 3500–5500 Å/minute. The film has a boron concentration level of between 2–6 wt % and a phosphorus concentration level of between 2–9 wt %.

The parameters in the above processes should not be considered limiting to the claims. The actual values (temperature, pressure, gas flows, etc.) selected for a particular recipe will vary according to desired characteristics of the resulting film. For example, the deposition rate of the film can be increased by increasing TEOS flow, within the above ranges, or by decreasing pressure. Also, flow values mentioned above are for a 200-mm wafer chamber, but would differ depending on the type or size of chamber used. One of ordinary skill in the art may also use other chemicals, chamber parameters, and conditions to produce similar films while using the present invention. Of course, such films may be deposited by other known methods as understood by one of ordinary skill in the art.

IV. Test Results and Measurements

Conventional BPSG process recipes have used nitrogen as the carrier gas. It was believed that the use of helium and nitrogen resulted in comparable gap fill, reflow capability, and stability. Accordingly, nitrogen has been the preferred carrier gas over helium, because nitrogen is cheaper. However, the present invention provides a method and apparatus for improving overall manufacturability by reducing residue build-up in the reactor system by using helium as the carrier gas. In addition to improving manufacturability, the present invention also provides a quality BPSG film with as good or even better properties than BPSG films formed using nitrogen as the carrier gas. As evidence of the superiority of the present invention's use of helium over nitrogen as the carrier gas in the BPSG TEOS/$O_3$ process, and to demonstrate the unexpected ability of helium to provide a cleaner process, experiments were performed using the same BPSG process recipe but with different carrier gases in an attempt to produce films having optimal characteristics (e.g., uniformity, gap fill/reflow capability, deposition rate).

Actual process conditions used in the experiments were as follows. Specifically, the BPSG films were deposited at a temperature of about 480° C. and at a pressure of about 200 torr. Spacing between the susceptor and manifold was preferred to be within 230 mil. The experiments were conducted in a lamp-heated DCVD Precision 5000 chamber (outfitted for 200-mm wafers) manufactured by Applied Materials, Inc.

Gas flows in the experiments included introducing TEB into the chamber at a rate of about 200 mgm, introducing TEPO at a rate of about 60 mgm, introducing TEOS at a rate of about 500 mgm, introducing oxygen as $O_3$ at a rate of about 4000 sccm, and introducing the carrier gas at a rate of about 6000 sccm.

Figure 3A:
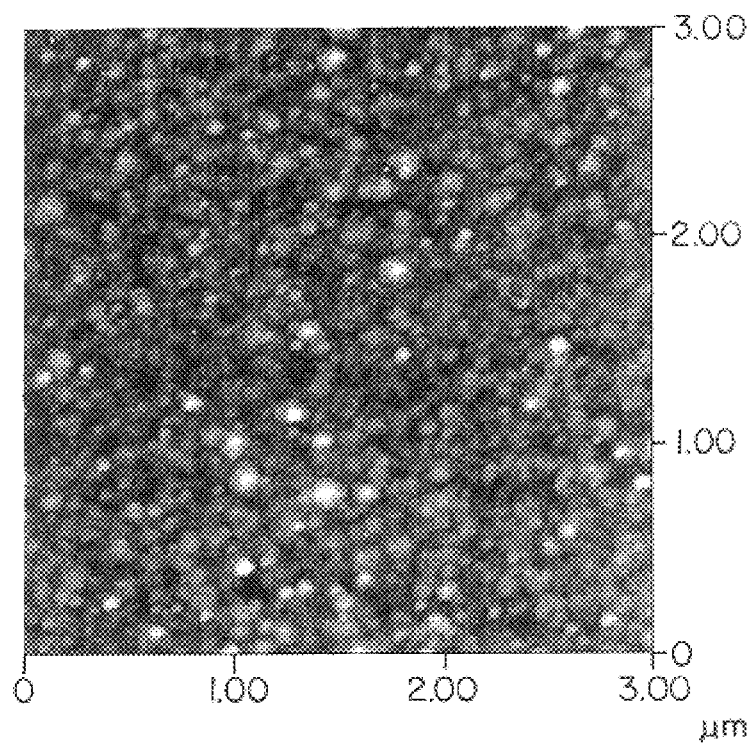
FIGS. 3(a)–3(b) are photomicrographs comparing the surface roughness of the BPSG films respectively formed using helium and nitrogen as the carrier gas.
Figure 3B:
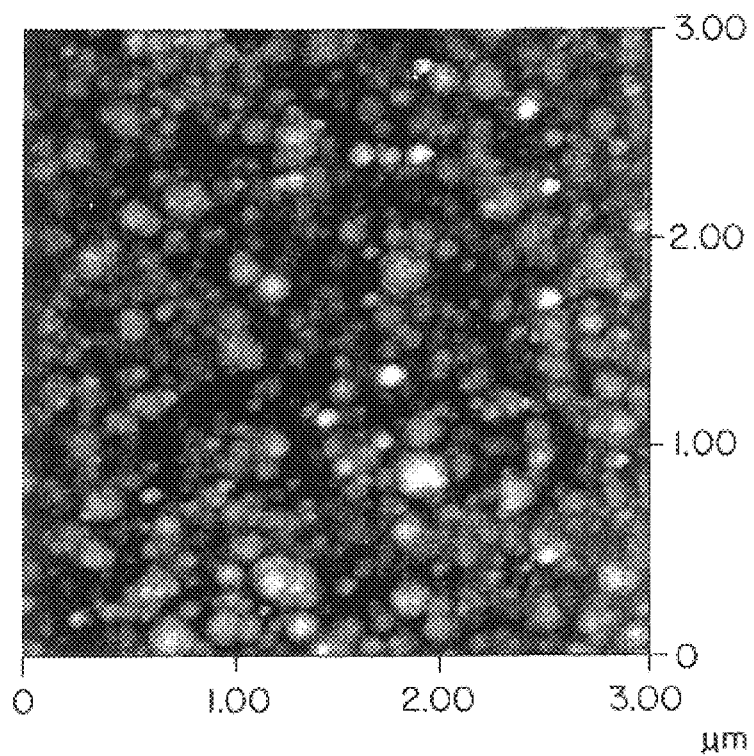
Figure 4A:
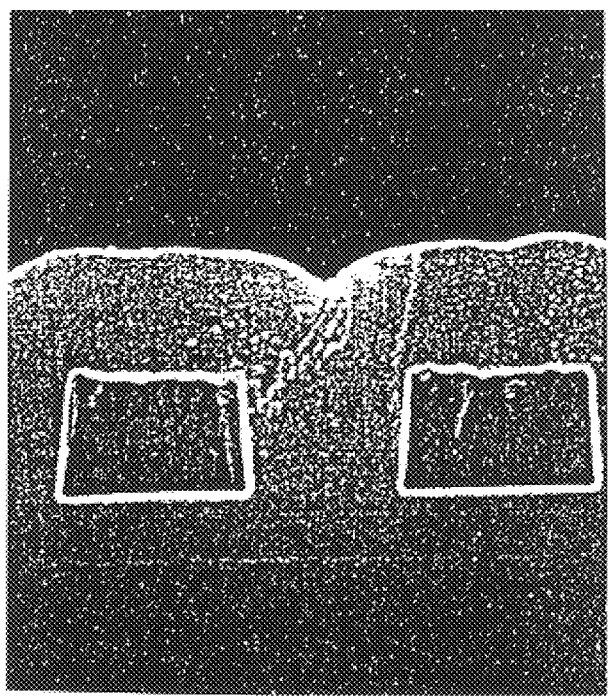
FIGS. 4(a)–4(d) are photomicrographs demonstrating the as-deposited gap fill capabilities of BPSG films formed using helium and nitrogen, respectively, as the carrier gas.
Figure 4B:
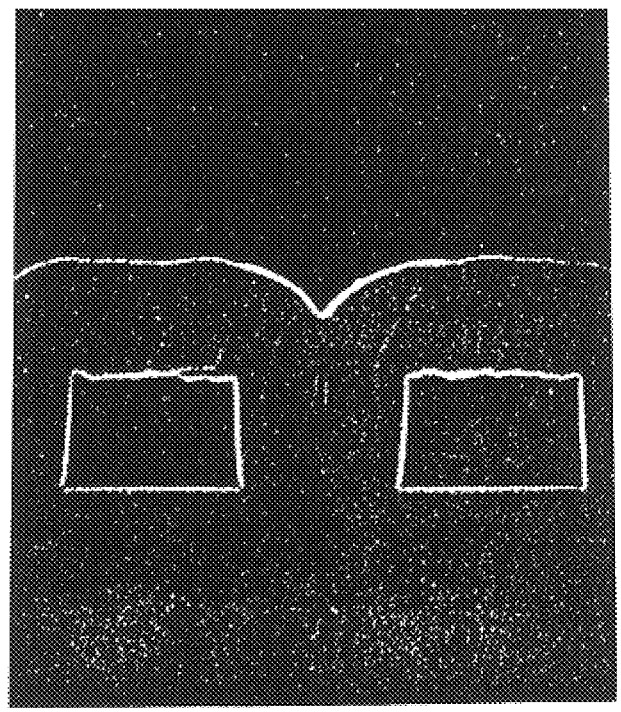
Figure 4C:
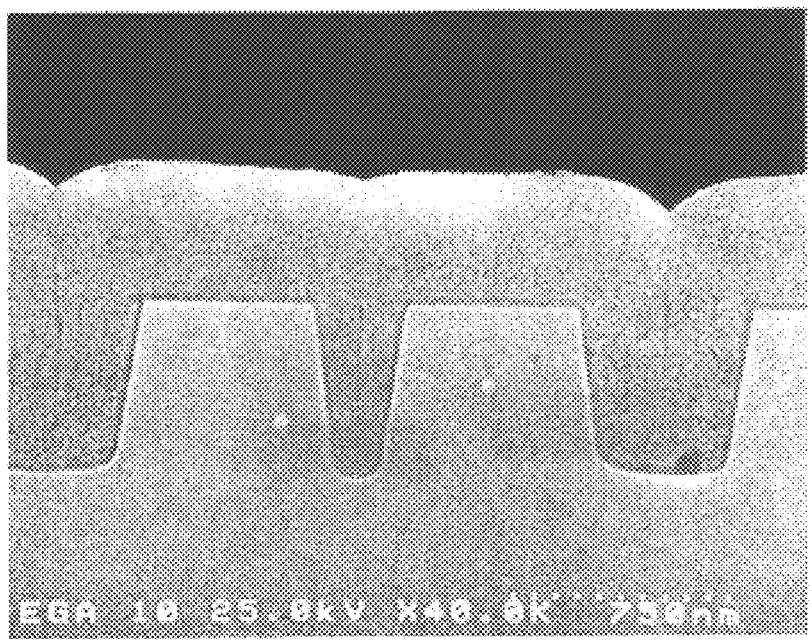
Figure 4D:
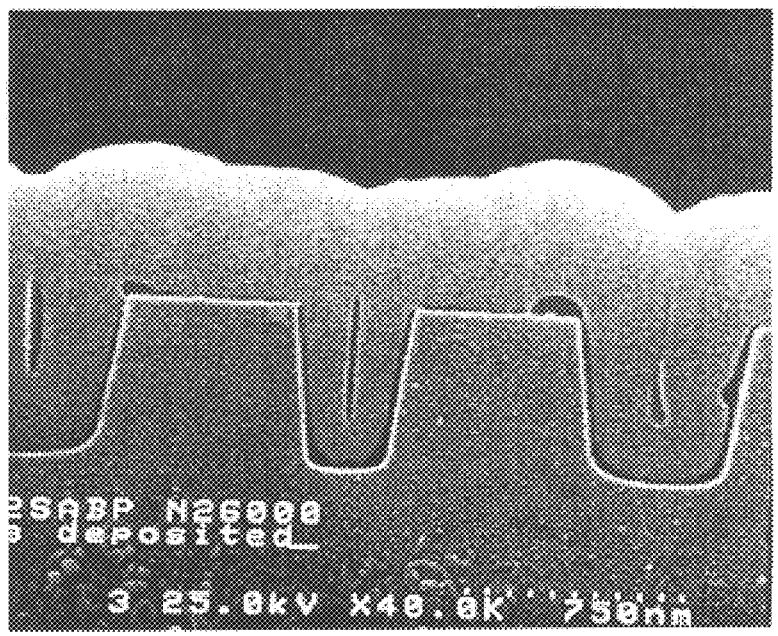
Figure 5A:
FIGS. 5(a)–5(f) are photomicrographs demonstrating the reflow gap fill capabilities of BPSG films formed using helium and nitrogen, respectively, as the carrier gas.
Figure 5B:
Figure 5C:
Figure 5D:
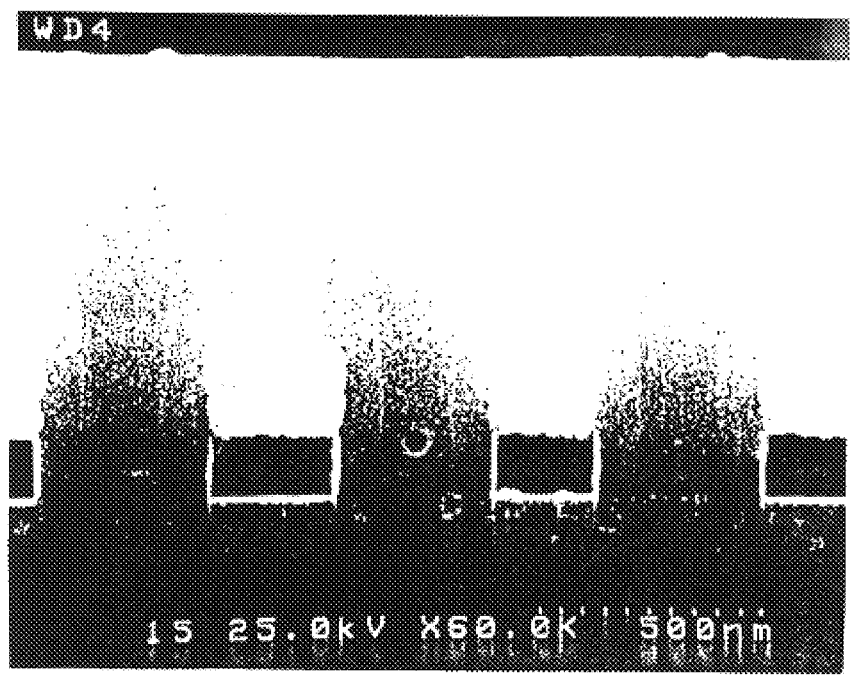
Figure 5E:
Figure 5F:

Experiments have shown that use of helium carrier gas in TEOS/$O_3$ BPSG processes results in a smoother film, as deposited, than when using the conventional nitrogen carrier gas. Surface roughness of the film may be measured by atomic force spectroscopy to quantify film smoothness. Surface roughness is indicated by the presence and size of surface formations on the film. The size of surface formations are measured and an average roughness is calculated. As shown in FIGS. 3($a$)–3($b$), the BPSG film formed using helium exhibits an average roughness of 0.91 nanometers (nm), while the film formed using nitrogen exhibits an average roughness of 3.02 nm. The use of helium carrier gas clearly produces films that are on the order of three times smoother than films produced by the use of nitrogen carrier gas.

It is believed that the presence of larger surface formations on the films produced using nitrogen carrier gas requires a certain amount of energy to make the rougher film smooth, thereby diverting more of the process energy needed for better gap filling capability. The decreased surface roughness of the film is believed to be related to the gap fill/reflow and residue-reducing properties of the BPSG process using helium as a carrier gas. Experiments prove that the use of helium as the carrier gas allows BPSG films to have improved gap filling capabilities such that the films are able to adequately cover adjacent poly layers separated by a spacing with an aspect ratio of at least 2.5:1 or more. (The aspect ratio or "AR" is defined as the height-to-spacing ratio of two adjacent steps.) Further, the use of helium results in high stability BPSG films with even lower reflow temperatures, which is particularly important since thermal budget becomes increasingly significant as device dimensions get even smaller.

The as-deposited gap fill properties of the BPSG film according to the present invention are illustrated in FIGS. 4($a$)–4($d$), which are photomicrographs showing the gap fill capabilities of various BPSG films on different structures with different ARs. With the as-deposited films, no reheating or annealing for film reflow is performed.

FIGS. 4($a$)–4($b$) illustrate the as-deposited gap fill properties of BPSG films deposited in a 0.5 μm space (AR of 1:1) between two adjacent metal lines. The processes used to form the BPSG films in FIGS. 4($a$)–4($b$) are the same except for the carrier gases used. As seen in FIG. 4($a$), the BPSG film formed using helium as carrier gas exhibits excellent as-deposited gap fill properties, filling the voids and gaps in between the spacing. However, the BPSG film formed using nitrogen as carrier gas, as shown in FIG. 4($b$), demonstrates poor gap fill properties, indicated by the unfilled void in the space. FIGS. 4($c$)–4($d$) highlight the relative as-deposited gap fill capability of BPSG films formed with different carrier gases by using different geometries. FIG. 4($c$) illustrates that the BPSG film formed using helium yields a better gap fill for a 0.20 μm space having an AR of 4:1. In comparison, the BPSG film formed using nitrogen exhibits poor gap fill for a larger space (0.25 μm) having an AR of 2.5:1, as shown in FIG. 4($d$). Even for device geometries with smaller spaces and larger ARs, consistent with decreasing device dimensions and increasing device integration, the BPSG film formed with helium according to the present invention results in improved as deposited gap fill over films formed with nitrogen.

In the present experiments, reflow was performed by annealing to illustrate the improved film capabilities using helium carrier gas. However, reflowing by a rapid thermal process also would illustrate these capabilities.

FIGS. 5($a$)–5($f$) demonstrate the gap fill properties after a 30-minute reflow by annealing of the BPSG films formed using helium and nitrogen carrier gases, respectively. FIGS. 5($a$)–5($b$) show BPSG films deposited on different structures (but having the same spacing and AR) by the same process but with different carrier gases. The BPSG film deposited using helium carrier gas exhibits excellent gap fill properties after reflow at a temperature of about 775° C., as seen in FIG. 5($a$). In contrast, the BPSG film deposited using nitrogen carrier gas exhibits poor gap fill properties after reflow at the higher temperature of about 850° C. In FIGS. 5($a$)–5($f$), the BPSG films have a 5 wt % boron concentration and a 5 wt % phosphorus concentration. As discussed earlier, it is known that increasing wt % of dopants may result in a desirable lowering of the reflow temperature. Despite the higher wt % in these BPSG films, the reflow temperature for the film formed using nitrogen is clearly inadequate. The gap is not filled and the reflow temperature may be too high for smaller device dimensions where thermal budget is often extremely tight.

FIGS. 5($c$)–5($d$) further illustrate the inadequacy of BPSG films formed with nitrogen for smaller device dimensions, as compared with films formed with helium. FIGS. 5($c$)–5($d$) both illustrate (after reflow) BPSG films formed using the same process, but with different carrier gases, over structures having the same 0.20 μm spacing and AR of 3:1.

FIG. 5($c$) shows the good gap fill of a BPSG film formed using helium carrier gas, after a reflow at a temperature of about 800° C. The reflow temperature of about 800° C. for a good gap fill BPSG film formed using helium carrier gas is relatively low and suitable for smaller dimension devices. Unlike FIG. 5($c$), which shows complete gap fill, FIG. 5($d$) shows voids remaining after a reflow (at the same temperature of about 800° C.) of the BPSG film formed using nitrogen carrier gas.

FIGS. 5($e$)–5($f$) provide evidence of further advantages of BPSG films formed using helium carrier gas compared with those formed with nitrogen carrier gas. FIGS. 5($e$)–5($f$) both show BPSG films, after reflow, formed over structures having the same 0.30 μm spacing and AR of 2.5:1.

As seen in FIG. 5($e$), the BPSG film formed using helium carrier gas exhibits good gap fill at the low reflow temperature of 775° C. The BPSG film formed using nitrogen carrier gas also exhibits good gap fill, but at the higher reflow temperature of 850° C., as seen in FIG. 5(f). For today's decreasing device dimensions and increasing device integration, the BPSG film formed with helium according to the present invention results in improved gap fill with much lower reflow temperatures compared with films formed with nitrogen, which are inadequate for tighter thermal budgets.

Figure 6A:
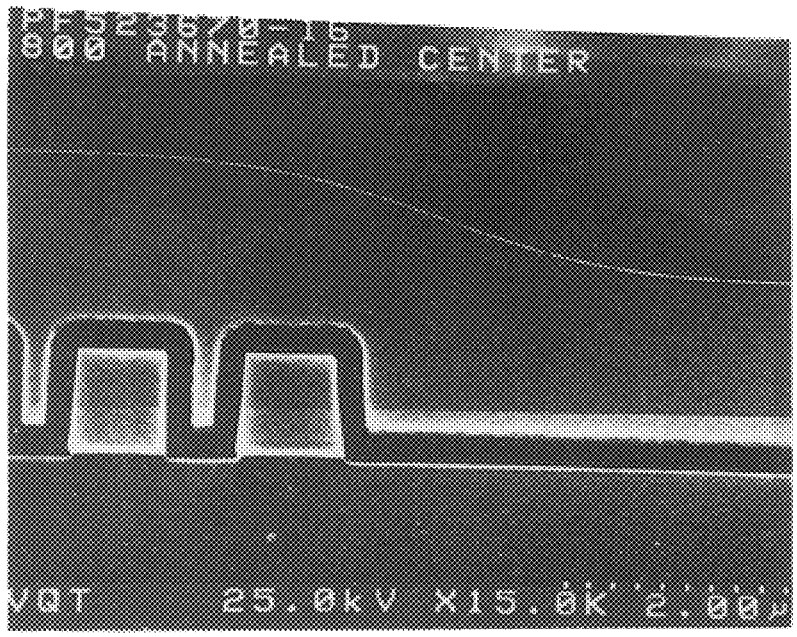
FIGS. 6(a)–6(b) are photomicrographs demonstrating the planarization of BPSG films formed using helium and nitrogen, respectively, as the carrier gas.
Figure 6B:
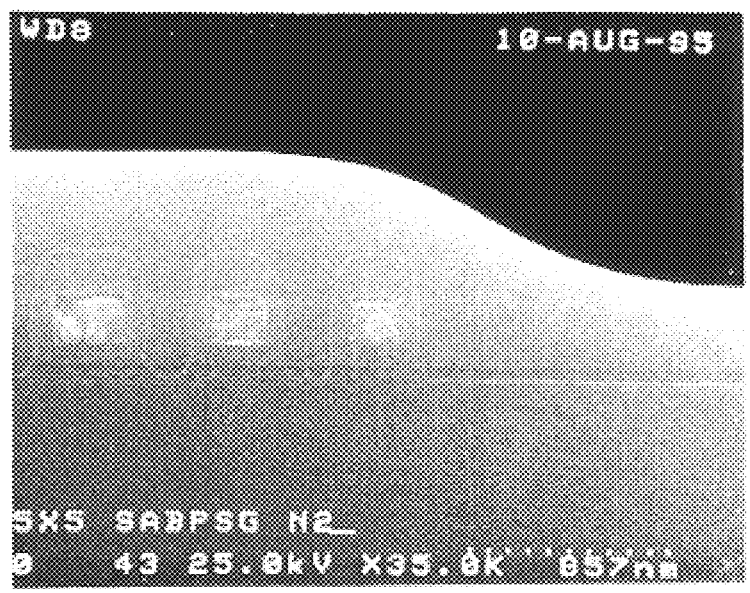

FIGS. 6(a)–6(b) further illustrate the improved planarization of BPSG films formed using helium carrier gas. As seen in FIG. 6(a), the 5 wt % boron concentration and 5 wt % phosphorus concentration BPSG film deposited using helium carrier gas exhibits a flow angle of about 20° when reflowed at a temperature of about 800° C. In contrast, the 5 wt % boron concentration and 5 wt % phosphorus concentration BPSG film deposited using nitrogen carrier gas exhibits a larger flow angle of about 31° when reflowed at a higher temperature of about 850° C. The structures in FIGS. 6(a)–6(b) both have the same height of 0.8 μm and were both reflowed for 30 minutes.

Figure 7:
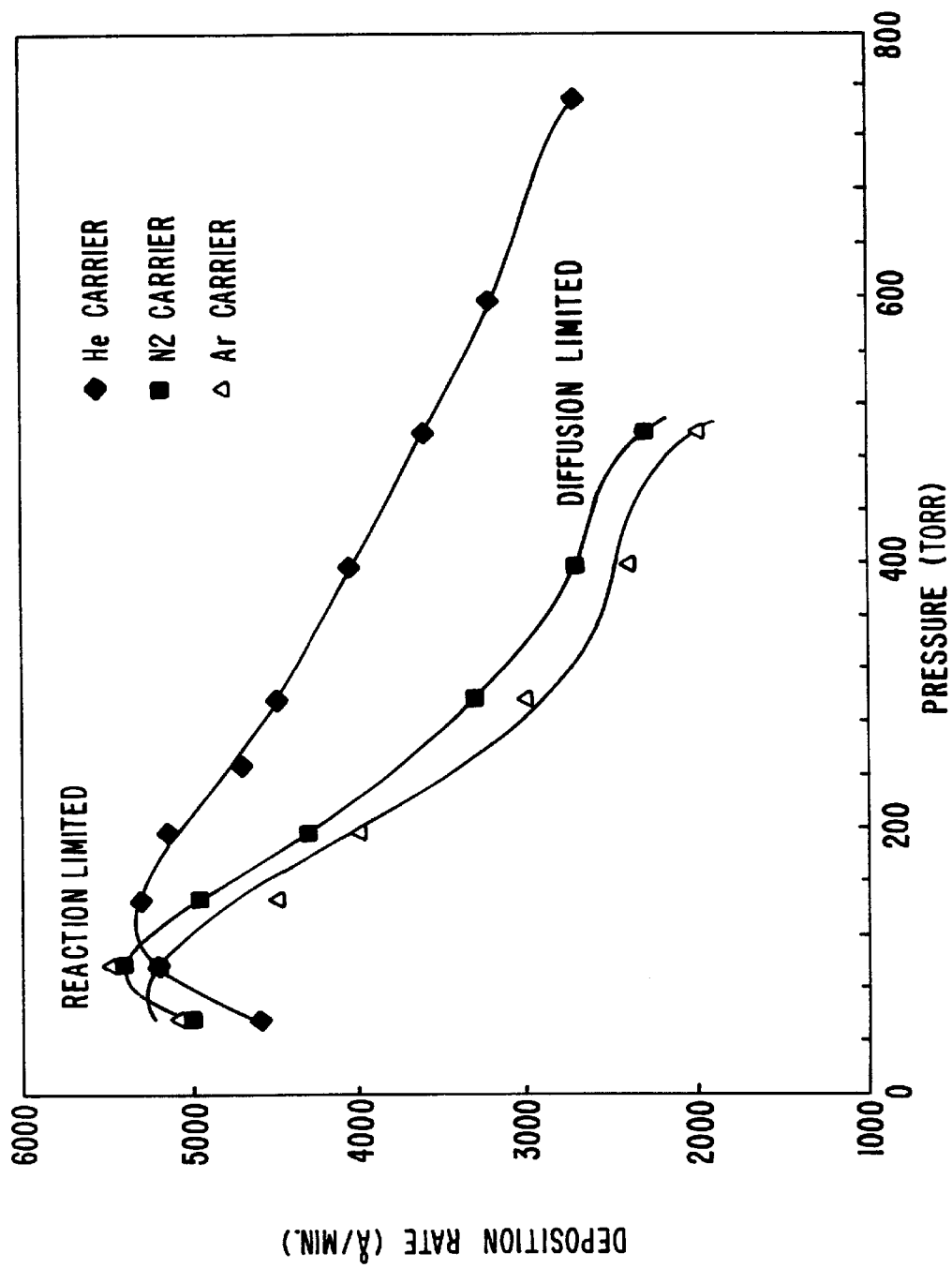
FIG. 7 is a graph showing BPSG deposition rates using different carrier gases.

FIG. 7 graphically depicts the deposition rate of BPSG films formed according to the recipe above using different carrier gases versus the pressure. The diamonds indicate the deposition rates for BPSG films formed using helium carrier gas, while the squares and triangles correspond to nitrogen and argon carrier gases, respectively. In addition to the improved gap fill/reflow capability of BPSG films formed using helium carrier gas, experiments depositing BPSG films over a varying pressure range have shown that the deposition rate for processes using helium carrier gas is higher than those for other carrier gases such as nitrogen or argon. Generally, the deposition rates decrease as pressure is decreased, regardless of the type of carrier gas used. The higher deposition rates using helium carrier gas are believed to result from the smaller size of the helium molecule compared with the nitrogen and argon molecules. That is, it is believed that the boron, phosphorus, silicon, and oxygen deposited have a more difficult time reaching the surface of the wafer through larger carrier gas molecules such as nitrogen or argon, as compared with the smaller helium carrier gas molecules. The boron, phosphorus, silicon, and oxygen may lose more energy or momentum through more frequent collisions with the larger molecules. This effect would increase as reactor pressure is increased, as evidenced by FIG. 7.

Figure 8:
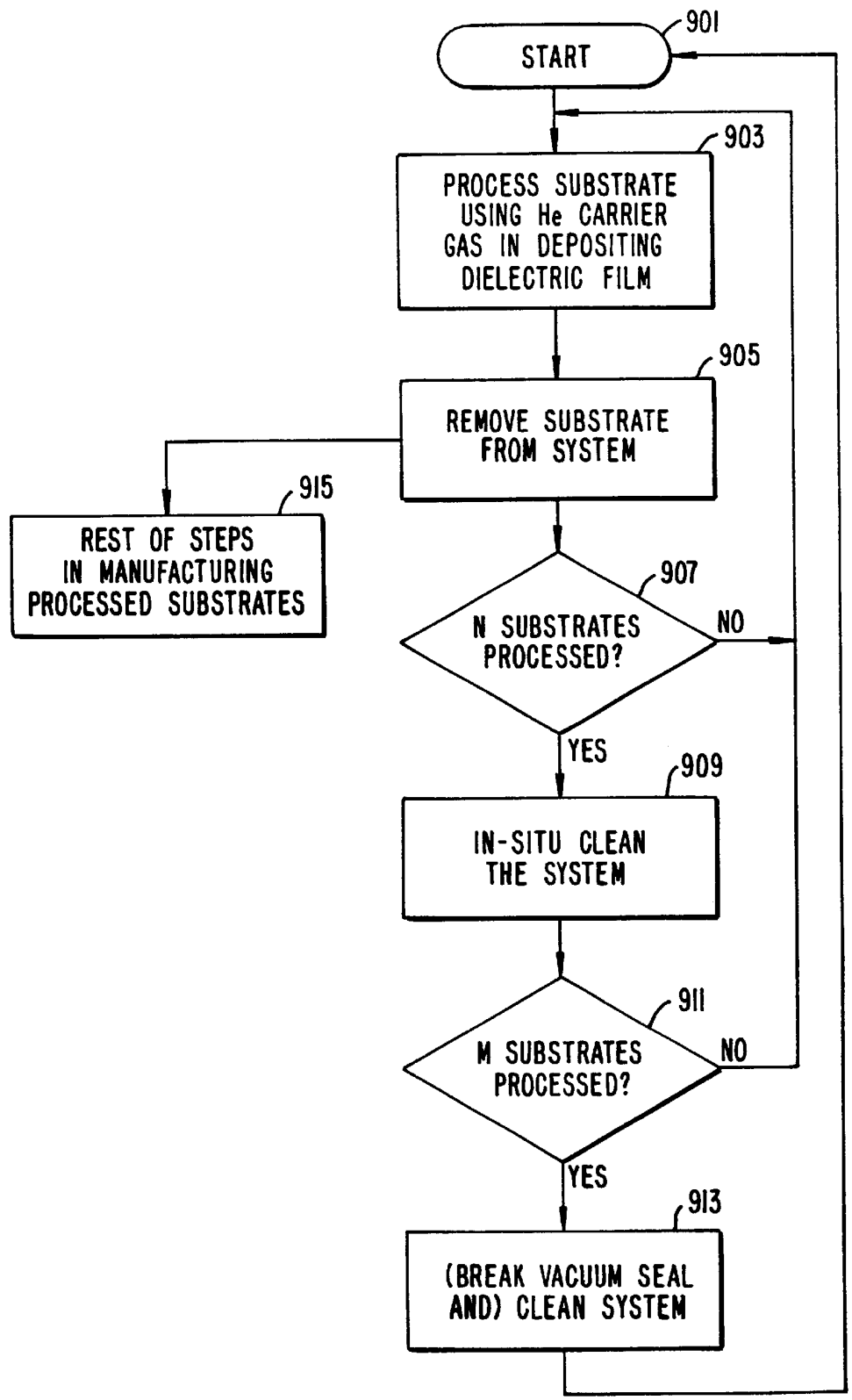
FIG. 8 is a simplified flow chart of the straight run process according to an embodiment of the invention.

FIG. 8 is a simplified flow chart of the straight run wafer process used to demonstrate an embodiment of the present invention. The start of the process of forming the dielectric film is indicated as 901. This process does not start until previous processes forming other underlying portions of the device have been performed upon the substrate, and the system is available for use. Upon start of the straight run, a substrate is processed (step 905) as discussed in detail above using helium carrier gas to deposit the dielectric film on the substrate. The substrate is then removed from the system in step 905. After removal, the substrate may continue in the manufacturing line where the remainder of steps required in manufacturing the processed substrate are performed (step 915). Step 915 may include planarization of the dielectric film by CMP, reflowing, or the like, as well as other subsequent manufacturing steps. After the substrate is removed, the system determines (step 907) the number of substrates processed so far. A counter or register in the processor may be used to determine how many substrates have been processed in the straight run up to that point. If less than n substrates have been processed in the straight run, step 903 is repeated for another substrate. However, if n substrates have been processed, the system performs at step 909 an in-situ plasma cleaning procedure which is done without breaking the vacuum seal and opening the chamber system when using a vacuum system. The value of n may be set to equal 1 or more. In the experiments using helium and nitrogen carrier gases, n was set to the value 1. After the in-situ cleaning, the system determines (step 911) whether the number of processed substrates equals m. If less than m substrates have been processed, step 903 is repeated for another substrate. If m substrates have been processed, the reactor system is opened and the system is cleaned in step 913. If a vacuum system is used, the vacuum seal is broken and the reactor system opened for the system cleaning. While the chamber is opened and being cleaned, the straight run process interrupts the rest of the steps required in continuing the manufacture of the processed substrates (indicated by step 915). The process of depositing the dielectric film of substrates can proceed after the chamber is sealed again when cleaning is completed. In the present experiments, which used a closed vacuum system, the cleaning procedure of step 913 involved breaking the vacuum seal and opening the chamber system to physically wipe down the entire chamber, including the foreline and other areas with accumulated residue, with a special cloth and cleaning fluids. The straight run experiment using helium carrier gas determined that the value of m was greater than about 3500 wafers at 6000 Å thickness per 200-mm wafer. The same straight run experiment, but using nitrogen carrier gas instead of helium carrier gas, demonstrated that the value of m was between about 300–500 wafers at 6000 Å thickness per 200-mm wafer. Of course, the values of n and m may be determined experimentally for variations of the processes used, according to the dielectric film thickness deposited, and then programmed into the memory of the system for automating the process to coordinate the performance of cleanings based on a count of the number of wafers.

Figure 9:
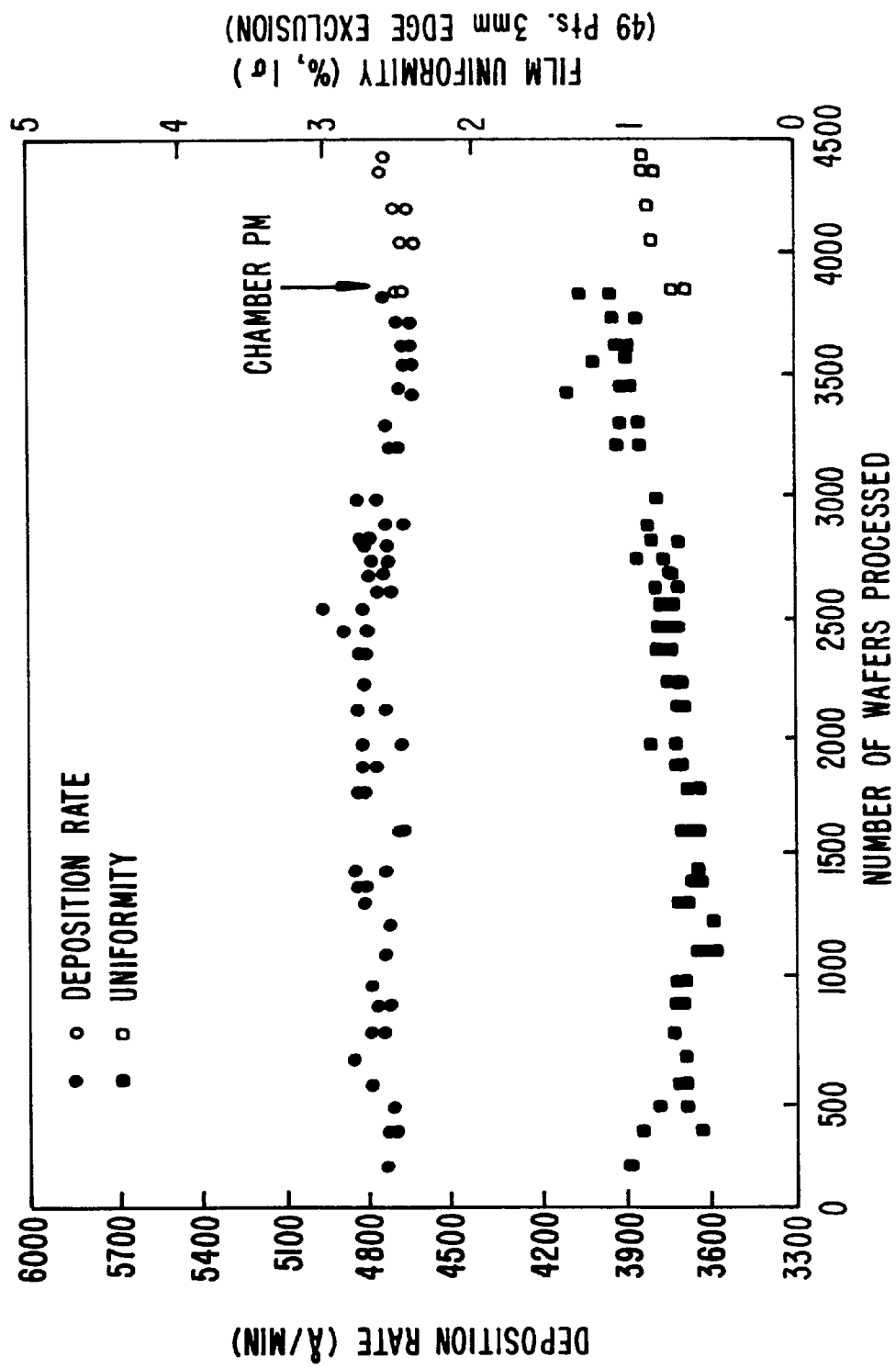
FIG. 9 is a graph demonstrating improved manufacturability by the number of wafers processed using helium carrier gas before chamber preventive maintenance needs to be performed.

FIG. 9 is a graph demonstrating improved manufacturability by the extended run of wafers processed using helium carrier gas before chamber preventive maintenance needs to be performed. In each experiment, the first type of closed-chamber cleaning method was used after every wafer in the extended run was processed. In particular, a plasma formed with a fluorine source gas (such as $C_2F_6$), oxygen ($O_2$), and nitrogen trifluoride ($NF_3$) was used in the closed-chamber cleaning process between the processing of each wafer. A representative sampling of the experimental results of a straight run of over 3500 wafers at 6000 Å thickness per 200-mm wafer processed according to the recipe discussed above using helium as carrier gas is shown in FIG. 8. The BPSG films were formed on the wafers at a deposition rate of substantially about 4800 Å/minute. FIG. 8 further provides an indication of the film uniformity of the BPSG films formed on the wafers. Film uniformity was measured by methods well known to one of ordinary skill in the art. As seen in FIG. 9, film thickness within-wafer uniformity consistently remains around 1%, 1 σ; and wafer-to-wafer uniformity is about 1.3%, 1 σ. The thickness was measured by using Prometrix equipment.

Figure 10:
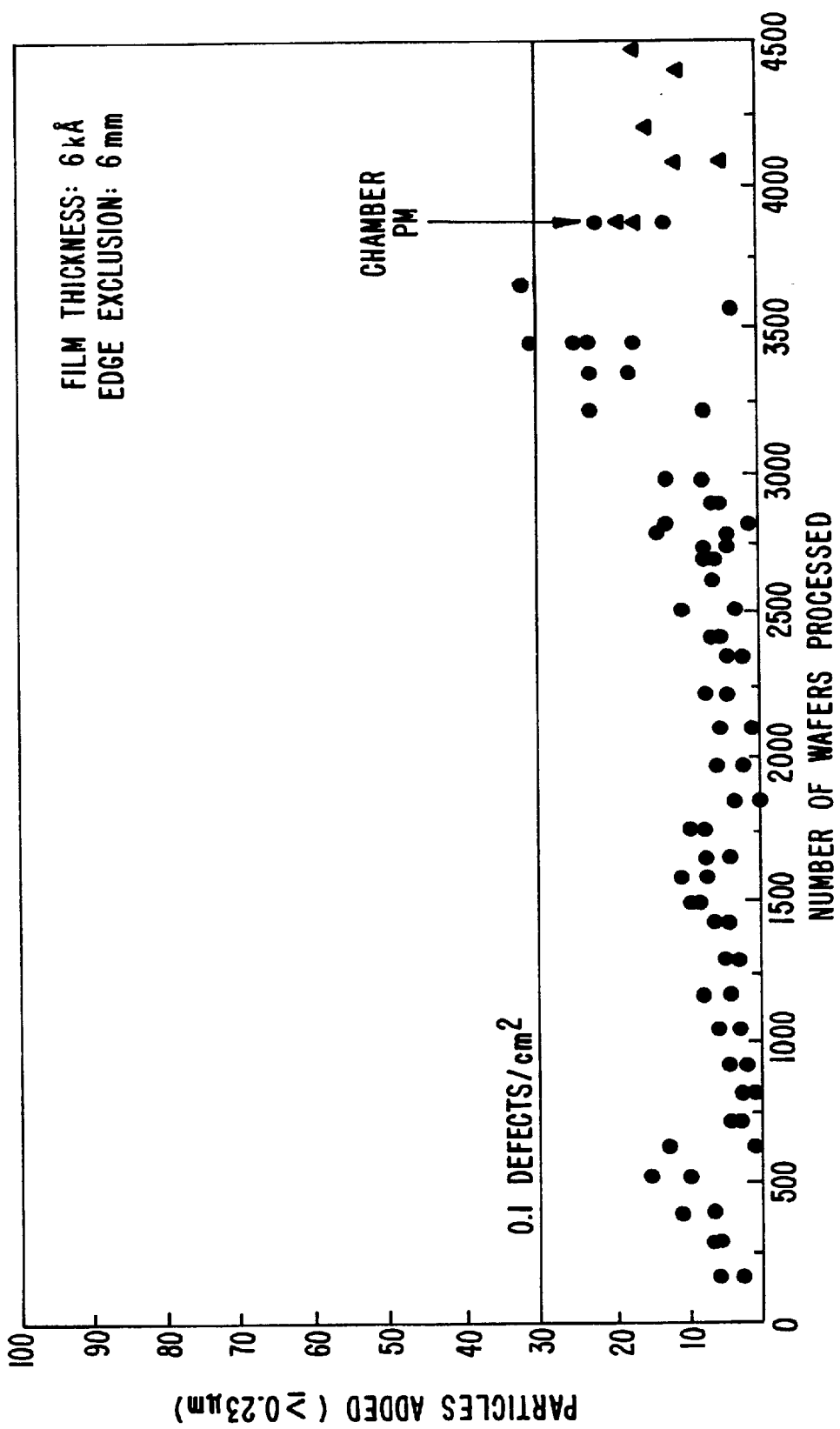
FIG. 10 is a graph demonstrating the particle performance for the extended run of wafers processed using helium carrier gas before preventive maintenance needs to be performed.

FIG. 10 is a graph illustrating the particle performance for the extended run of wafers using helium carrier gas without preventive maintenance cleaning of the reactor system. A representative sampling of the experimental results of a straight run of over 3500 wafers at 6000 Å per 200-mm wafer processed according to the recipe above is shown. The particle performance remained less than about 0.05 defects/$cm^2$ for over 3000 wafers before preventive maintenance cleaning was done.

An extended run of wafers processed according to the same recipe discussed above, but using nitrogen as carrier gas, resulted in the need to perform a chamber preventive maintenance cleaning after only about 500 wafers. For conventional BPSG processes using nitrogen carrier gas, typically a preventive maintenance cleaning of the chamber is required after processing about 300–500 wafers at 6000 Å thickness per 200-mm wafer. If preventive maintenance cleaning is not performed, the throttle valve may fail due to excess residue deposits in the throttle valve area, resulting in particle problems. Thus, wafers processed beyond the 300–500 wafer range may not reach the threshold for quality wafers. In a chamber inspection just prior to chamber preventive maintenance cleaning, oxide residue build-up in various parts of the chamber could be seen. In particular, large amounts of the residue had accumulated in the vacuum line 31 or foreline of the chamber near the throttle valve 32, as well as in the area between the gas mixing box 19 and the gas manifold 11. Preventive maintenance cleaning removes the residue build-up in the system, and frequently can take hours to complete. Performing this necessary maintenance cleaning of the system involves opening and then manually wiping down the chamber system with cleaning fluids to remove residue build-up. The gas manifold is also replaced due to residue build-up and clogging of holes in the gas manifold. The preventive maintenance cleanings not only consume time, and cause an interruption in the manufacture of usable wafers, but also increase both the total turn-around-time for completed wafers and the cost of consumables such as the gas manifold.

In contrast, an inspection of the chamber after a straight run of 3500 wafers at 6000 Å thickness per 200-mm wafer using helium as carrier gas revealed reduced residue build-up as well as good particle performance as seen in FIGS. 9 and 10. The use of helium as carrier gas in the BPSG process reduces residue formed in the foreline or exhaust area of the chamber, and virtually eliminates any residue formed in between the gas mixing box and the gas manifold 11. The gas manifold did not need to be replaced when using helium due to the lack of residue build-up.

A comparison of accumulated deposited film thickness for 200-mm wafers is one way to illustrate the advantages of helium processes over nitrogen processes. For a 200-mm wafer chamber, the accumulated deposited film thickness is the number of wafers processed multiplied by the film thickness per wafer. In the present experiments, the BPSG film was deposited at a 6000 Å thickness per 200-mm wafer. Helium use resulted in up to at least 3000 wafers before preventive maintenance cleaning was required, and nitrogen use resulted in only between about 300–500 wafers before preventive maintenance cleaning was needed. Thus, the BPSG process using helium carrier gas results in an accumulated deposited film thickness of up to at least 1800 $\mu$m of accumulated deposited film thickness for 200-mm wafers. In contrast, the same BPSG process using nitrogen carrier gas has an accumulated deposited film thickness of between about 180–300 $\mu$m for 200-mm wafers before a preventive maintenance system cleaning is needed. Of course, the above numbers apply to 200-mm wafers, but the improvements using helium instead of nitrogen also would apply to other size substrates, chambers, etc.

Unexpectedly, manufacturability increased by more than about 600% when using helium in the BPSG process as compared with using nitrogen thereby extending the period between cleanings. It is believed that the higher thermal conductivity of helium compared with nitrogen may be a factor in decreasing the residue build-up in the system.

It is to be understood that the above description is intended to be illustrative and not restrictive. Many embodiments will be apparent to those of skill in the art upon reviewing the above description. By way of example, the inventions herein have been illustrated primarily with regard to one BPSG process recipe illustrating the use of helium as carrier gas, but they are not so limited. For example, helium may be introduced into the chamber by a separate gas line, rather than being used solely as a carrier gas. As another example, the dielectric film formed according to other embodiments may be BSG, PSG, fluorine-doped silicate glass (FSG), germanium-doped silicate glass, undoped silicate glass (USG), or other types. By way of further example, while the illustrated embodiments concerned a process using TEOS as a source of silicon and ozone as a source of oxygen, it is possible to use other silicon sources such as silane, other oxygen sources such as nitrous oxide ($N_2O$), carbon monoxide (CO) or others, or other dopant sources, depending on the particular application. Also, different types of systems such as SACVD, APCVD, PECVD, and others can be used according to embodiments of the invention. Further, it is believed that gases with higher thermal diffusivity than nitrogen or argon may also provide advantages similar to those produced by helium. Those skilled in the art will recognize other equivalent or alternative methods of depositing the dielectric layer, while remaining within the scope of the claims of the present invention. The scope of the invention should, therefore, be determined not with reference to the above description, but should instead be determined with reference to the appended claims, along with the full scope of equivalents to which such claims are entitled.

What is claimed is:

1. In a method for forming a BPSG dielectric film on a substrate by flowing a process gas containing silicon, oxygen, and dopant atoms into a chamber of a semiconductor processing system, the improvement comprising:

using helium in place of nitrogen as the carrier gas for at least a portion of said process gas in the system for forming the BPSG dielectric film from TEOS and $O_3$ at a pressure of between about 10 and 760 torr and a temperature of between about 100° C. and 750° C. to process more substrates in the system between cleanings.

2. The method of claim 1 wherein the improvement further comprises using helium in place of nitrogen as the carrier gas for at least a portion of said process gas in the system to reduce a temperature for annealing the BPSG dielectric films formed on the substrate by said process.

3. The method of claim 2 wherein said first dopant atoms comprise boron, said process gas further includes second dopant atoms comprising phosphorus, and said lower temperature is 800° C. and less.

4. The method of claim 3 wherein said annealing step reflows the dielectric film over structures having an aspect ratio of greater than about 2.5:1.

5. The method of claim 4 wherein the improvement further comprises using helium in place of nitrogen as the carrier gas for at least a portion of said process gas in the system to process at least 10% more substrates between cleanings.

6. The method of claim 1 wherein the improvement further comprises using helium in place of nitrogen as the carrier gas for at least a portion of said process gas in the system to process at least 100% more substrates between cleanings than a process using nitrogen as carrier gas.

7. The method of claim 1 wherein the improvement further comprises using helium in place of nitrogen as the carrier gas for at least a portion of said process gas in the system to process at least 600% more substrates between cleanings than a process using nitrogen as carrier gas.

8. The method of claim 1 wherein said process gas further comprises TEB and TEPO.

9. In a method for forming a BPSG layer on a substrate by flowing a process gas containing silicon, oxygen, and dopant atoms into a chamber of a semiconductor processing system under process conditions which require a cleaning of a substrate processing system upon depositing an accumulated deposited film thickness when using nitrogen in said system, the improvement comprising:

using helium in place of nitrogen as the carrier gas for at least a portion of said process gas in the system for forming the BPSG layer from TEOS and $O_3$ at a pressure of between about 10 and 760 torr and a temperature of between about 100° C. and 750° C. to deposit an accumulated deposited film thickness of greater than said accumulated deposited film thickness of about 350 μm on n substrates for nitrogen before a next cleaning of said system.

10. The method of claim 9 wherein said next cleaning involves opening the system to physically wipe down portions of said system.

11. The method of claim 10 wherein said dopant atoms are comprised of boron and phosphorus.

12. The method of claim 11 wherein said boron is provided from TEB.

13. The method of claim 11 wherein said phosphorus is provided by TEPO.

14. The method of claim 11 wherein said boron is from TEB and said phosphorus is from TEPO.

15. The method of claim 10 wherein said accumulated deposited film thickness is greater than 600 μm.

16. The method of claim 10 wherein said accumulated deposited film thickness is greater than 1000 μm.

17. The method of claim 10 wherein said accumulated deposited film thickness is greater than 1800 μm.

18. The method of claim 9 wherein said helium gas is a carrier gas for vaporized liquid sources of said process gas.

19. In a process for forming a BPSG layer on a substrate in a reactor by flowing a process gas containing silicon, oxygen, and dopant atoms into the reactor, the improvement comprising:

using helium in place of nitrogen as the carrier gas for at least a portion of said process gas from TEOS and $O_3$ in the system for forming the BPSG layer on n substrates at a pressure of between about 10 and 760 torr and a temperature of between about 100° C. and 750° C. to have an accumulated deposited film thickness on said n substrates at least 50% greater than that for nitrogen.

20. The process of claim 19, wherein said dopant atoms are from TEB and TEPO.

21. The process of claim 20 wherein said accumulated deposited film thickness is about 1800 μm or greater.

22. The process of claim 21 wherein said n substrates comprise at least 1000 substrates.

23. The process of claim 21 wherein said n substrates comprise at least 3000 substrates.

24. The process of claim 19, further comprising substantially planarizing the deposited film.

25. The process of claim 19, comprising planarizing the deposited film by reheating the deposited film at a temperature of 800° C. and less to reflow the deposited film.

* * * * *